(12) United States Patent
Lee et al.

(10) Patent No.: US 8,923,062 B1
(45) Date of Patent: Dec. 30, 2014

(54) GENERATING READ THRESHOLDS USING GRADIENT DESCENT AND WITHOUT SIDE INFORMATION

(71) Applicant: SK hynix memory solutions inc., San Jose, CA (US)

(72) Inventors: Frederick K. H. Lee, Mountain View, CA (US); Jason Bellorado, San Jose, CA (US); Arunkumar Subramanian, Santa Clara, CA (US); Lingqi Zeng, Turlock, CA (US); Xiangyu Tang, San Jose, CA (US); Ameen Aslam, Santa Clara, CA (US)

(73) Assignee: SK hynix memory solutions inc., San Jose, CA (US)

( * ) Notice: Subject to any disclaimer, the term of this patent is extended or adjusted under 35 U.S.C. 154(b) by 0 days.

(21) Appl. No.: 13/935,714

(22) Filed: Jul. 5, 2013

Related U.S. Application Data

(60) Provisional application No. 61/668,572, filed on Jul. 6, 2012.

(51) Int. Cl.
*G11C 11/34* (2006.01)
*G11C 16/06* (2006.01)

(52) U.S. Cl.
CPC .................................... *G11C 16/06* (2013.01)
USPC ............ 365/185.18; 365/185.22; 365/185.24; 365/174; 365/189.011; 365/189.17

(58) Field of Classification Search
USPC .................. 365/185.18, 185.22, 185.24, 174; 365/189.011, 189.17
See application file for complete search history.

(56) References Cited

U.S. PATENT DOCUMENTS

| 8,243,514 B2 * | 8/2012 | Kang et al. | 365/185.03 |
| 2012/0182810 A1 * | 7/2012 | Radke et al. | 365/185.21 |
| 2014/0126285 A1 * | 5/2014 | Kang | 365/185.2 |

* cited by examiner

*Primary Examiner* — Fernando Hidalgo
(74) *Attorney, Agent, or Firm* — Van Pelt, Yi & James LLP

(57) ABSTRACT

A next read threshold is determined by determining a first number of solid state storage cells having a stored voltage which falls into a first voltage range and determining a second number of solid state storage cells having a stored voltage which falls into a second voltage range. A gradient is determine by taking a difference between the first number of solid state storage cells and the second number of solid state storage cells. The next read threshold is determined based at least in part on the gradient.

25 Claims, 9 Drawing Sheets

US 8,923,062 B1

GENERATING READ THRESHOLDS USING GRADIENT DESCENT AND WITHOUT SIDE INFORMATION

CROSS REFERENCE TO OTHER APPLICATIONS

This application claims priority to U.S. Provisional Patent Application No. 61/668,572 entitled METHOD FOR FINDING BER-OPTIMAL READ THRESHOLDS FOR HARD-READ NAND DEVICES WITHOUT SIDE INFORMATION filed Jul. 6, 2012 which is incorporated herein by reference for all purposes.

BACKGROUND OF THE INVENTION

Unlike magnetic storage, solid state storage (e.g., NAND Flash) requires selection of a read threshold. The value of the read threshold affects the hard read values which are returned, so selection of the read threshold is an important step in the read process. To assist in selecting a good read threshold value, some other systems store side information, such as a number of 1 or 0 values which were written to a given group of cells (e.g., a particular sector or codeword) or a ratio of 1 to 0 values which are actually stored by a given group of cells. The amount of overhead information this consumes can be very significant, even if only a few bits of side information are stored for each group. New techniques for selecting a read threshold which do not require side information would be desirable. It would also be desirable if these new techniques scale nicely as the number of bits stored per cell increases and as the number of read thresholds involved increases. In contrast, some other techniques take increasingly longer to select next read thresholds as the number of bits stored per cell increases and as the number of read thresholds involved increases.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

A gradient descent read threshold generation technique for solid state storage systems is described herein. This technique is applicable to a variety of solid state storage systems, including single-level cell (SLC) systems which store a single bit per cell, multi-level cell (MLC) systems which store two bits per cell, and tri-level cell (TLC) systems which store three bits per cell. First, some SLC embodiments are described. Then, some MLC embodiments are described.

Figure 1:
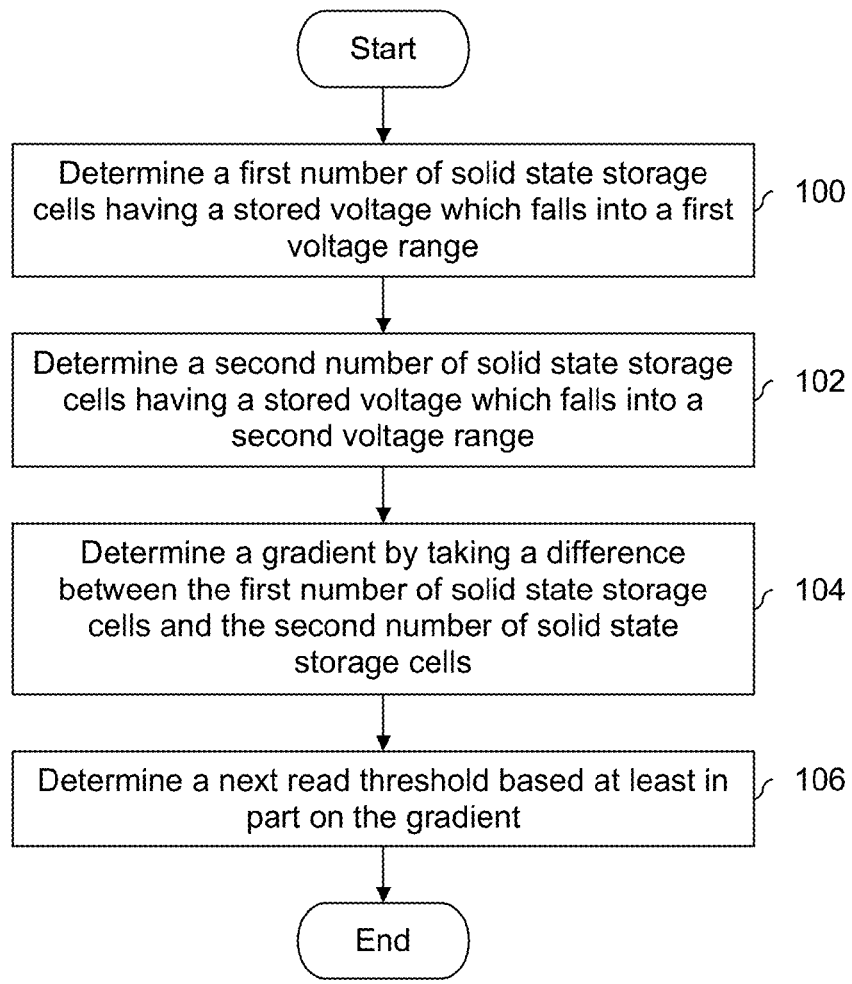
FIG. 1 is a flowchart illustrating an embodiment of a process for determining a next read threshold using one or more gradients and without taking side information into account.

FIG. 1 is a flowchart illustrating an embodiment of a process for determining a next read threshold using one or more gradients and without taking side information into account. In some embodiments, the process is performed by read threshold generator in a solid state storage system (e.g., a NAND Flash storage system).

At 100, a first number of solid state storage cells having a stored voltage which falls into a first voltage range is determined. For example, suppose the first voltage range is [R2, R1] where R1 and R2 are both positive values. For a given group of solid state storage cells (e.g., a particular codeword or a particular sector), some number of cells in the group are storing or have voltages which fall in the range [R2, R1]; that number or count is what is determined at 100.

In one example of how the first number is determined at 100, two reads of the group of cells is performed using a read threshold of R1 and a read threshold of R2. In some embodiments, R1 is set to a stored or default value and a specified offset (e.g., $\Delta$) is used to obtain R2 (e.g., R2=R1+$\Delta$). The read at R1 returns one or more of the following values:

$Z_{R1}$, which is the number of cells read back as a 0 when read at the read threshold R1; and/or $O_{R1}$, which is the number of cells read back as a 1 when read at the read threshold R1.

A read at the read threshold R2 similarly returns one or more of the following values:

$Z_{R2}$, which is the number of cells read back as a 0 when read at the read threshold R2; and/or $O_{R2}$, which is the number of cells read back as a 1 when read at the read threshold R2.

If A is the number of solid state storage cells having a stored voltage in the range [R2, R1], then A equals the number of cells which "flip" (e.g., 1→0 or 0→1) when going from R1 to R2 or vice versa. That is, $$A = Z_{R2} - Z_{R1} = O_{R1} - O_{R2}.$$

As indicated by the above equation, either cells read back as a 0 may be used to determine the first number of solid state storage cells (i.e., $A = Z_{R2} - Z_{R1}$) or cells read back as a 1 may be used to determine the first number of solid state storage cells (i.e., $A = O_{R1} - O_{R2}$).

Returning to FIG. 1, at 102, a second number of solid state storage cells having a stored voltage which falls into a second voltage range is determined. In some embodiments (including examples described herein), the first voltage range and the second voltage range have the same width. For example, this may make calculations easier.

In one example of step 102, let B be the number of solid state storage cells having a stored voltage which falls in the range of [R3, R2]. In this particular example, (R1−R2)=(R2−R3). A process similar to that described for step 100 may be performed to obtain B. For example, $$B = Z_{R3} - Z_{R2} = O_{R2} - O_{R3}$$

where $Z_{R3}$ and $O_{R3}$ are the number of cells read back as a 0 and 1 (respectively) when read at the read threshold R3. Note that since $Z_{R3} > Z_{R2} > Z_{R1}$ and $O_{R1} > O_{R2} > O_{R3}$, both A and B are positive values.

At 104, a gradient is determined by taking a difference between the first number of solid state storage cells and the second number of solid state storage cells. In embodiments described herein, the sign of the gradient matters, so the difference is consistently calculated with the first number as the minuend and the second number as the subtrahend (or vice versa). In examples described herein, the gradient is defined to be (A−B) but naturally other embodiments may have the opposite sign (i.e., the gradient defined to be (B−A).

Although examples described herein show first and second voltage ranges with the same widths, in some embodiments the widths of the first voltage range and the second voltage range are not the same, but the widths of the two voltage ranges is known so that the different widths can be taken into account before the gradient is calculated. For example, if the second voltage range is twice as wide as the first voltage range, then the second number of solid state storage cells may be divided by 2 to scale it accordingly. After any scaling, a gradient may be determined.

At 106, a next read threshold is determined based at least in part on the gradient. In some embodiments, two thresholds (T1 and T2) are used at 106 where T1 and T2 are positive values. Some examples of this are described in further detail below. In some embodiments, the determination at 106 further depends upon a previous gradient, a previous state, or a previous decision (e.g., in addition to a current gradient, a current state, or a current decision).

In some embodiments, the determination at 106 is performed without taking into consideration a known property associated with stored data (also referred to as side information). For example, some other systems store a number or ratio of written 0s or 1s for a give group of cells. When that group of cells is read back, the stored number or ratio of 0s/1s is used to assist in selecting a next read threshold. This requires storing a non-trivial amount of overhead information which is undesirable. One benefit to the gradient descent technique described herein is that it does not require side information to be stored.

In another example, some other systems apply a charge constrained code to stored data which (in one example charge constrained code) constrains or limits the number of excess 1s or 0s in a bit sequence. A known property of the stored data (e.g., used by those other systems in selecting a next read threshold) is that the number of excess 1s or 0s in the stored data is within some bound or range. Naturally, such systems require the inclusion of a charge constraint encoder in the write processor and a charge constraint decoder in the read processor. Also, overhead information must be stored in order for the charge constraint decoder to properly recover the original data from the charge constrained data. As can be imagined, there may be applications in which one or both of these requirements is/are undesirable. A benefit to the gradient descent technique described herein is that it can work (if desired) without the use of a charge constraint code and its associated requirements.

For brevity, FIG. 1 does not show terminations (e.g., earlier than shown in the figure) due to correctly completing error correction decoding. For example, hard read values obtained using the read thresholds R1, R2, and R3 may be passed to an error correction decoder, such as a low-density parity-check (LDPC) decoder or a BCH decoder. If error correction decoding is successful after any of the reads at R1, R2, or R3 then the process terminates. For example, if, after a first read at R1, error correction decoding is successful then no second read or third read is performed and the process of FIG. 1 terminates (e.g., wherever it is at in the process).

The following figures show some example scenarios which may be encountered by the example process shown in FIG. 1. In the following examples, reads are performed from right to left (i.e., from higher read thresholds to lower read threshold), but naturally in some other embodiments the direction can be reversed.

Figure 2:
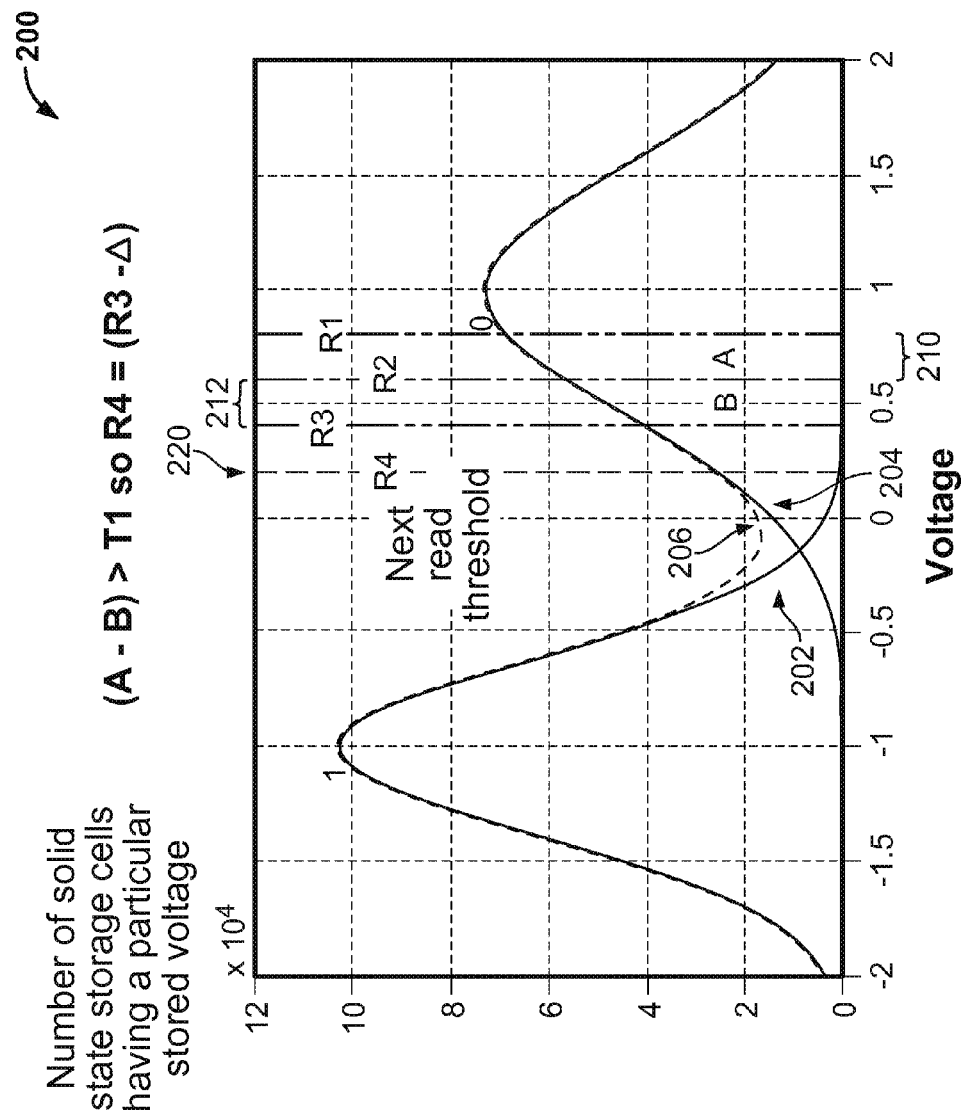
FIG. 2 is a diagram showing an embodiment of positive gradient which is greater than a first threshold.

FIG. 2 is a diagram showing an embodiment of positive gradient which is greater than a first threshold. In diagram 200, function 202 shows the distribution of cells which were written with or actually store a 1 and function 204 shows the distribution of cells which were written with or actually store a 0. Functions 202 and 204 are not known to and/or observable by a storage controller, but function 206, which is the sum of function 202 and 204, is observable by a storage controller (e.g., given enough reads).

In this particular example, lower voltages are associated with a 1 and higher voltages are associated with a 0. (Naturally, the opposite bit assignment may be used in some other embodiments.) With this bit assignment, if a cell has a voltage below a given read threshold value, then a 1 is returned. If a cell has a voltage that is greater than a given read threshold value, then a 0 is returned. As a result, the value of the read threshold used affects the hard read values that are returned from a group of cells.

The read thresholds R1, R2, and R3 create or define two voltage ranges: a first voltage range (210) which spans [R2, R1] and a second voltage range (212) which spans [R3, R2]. A is the number of cells in a group (e.g., in a sector or in a codeword) which have or store voltages which fall into [R2, R1] and B is the number of cells which have voltages in the range of [R3, R2]. For example, a cell which has a stored voltage of 0.5 would contribute toward the count of B.

In this particular example, after performing the three reads, it is determined that (A−B)>T1. The difference (i.e., A−B) is a gradient where the sign of the gradient points to or indicates a direction in which the local minimum of function 206 is believed to be. In examples described herein (i.e., where the gradient is (A−B) as opposed to (B−A)), a positive gradient corresponds to "it is believed a/the local minimum is to the left of the first voltage range and second voltage range" and a negative gradient corresponds to "it is believed a/the local minimum is to the right of the first voltage range and second voltage range." As a result, the fourth read threshold (R4) is selected to be to the left of first voltage rage 210 and second range 212 since the gradient is positive and it is greater than a first threshold (i.e., (A−B)>T1). More specifically, the next read threshold (R4) is selected to be (R3−Δ).

Figure 3:
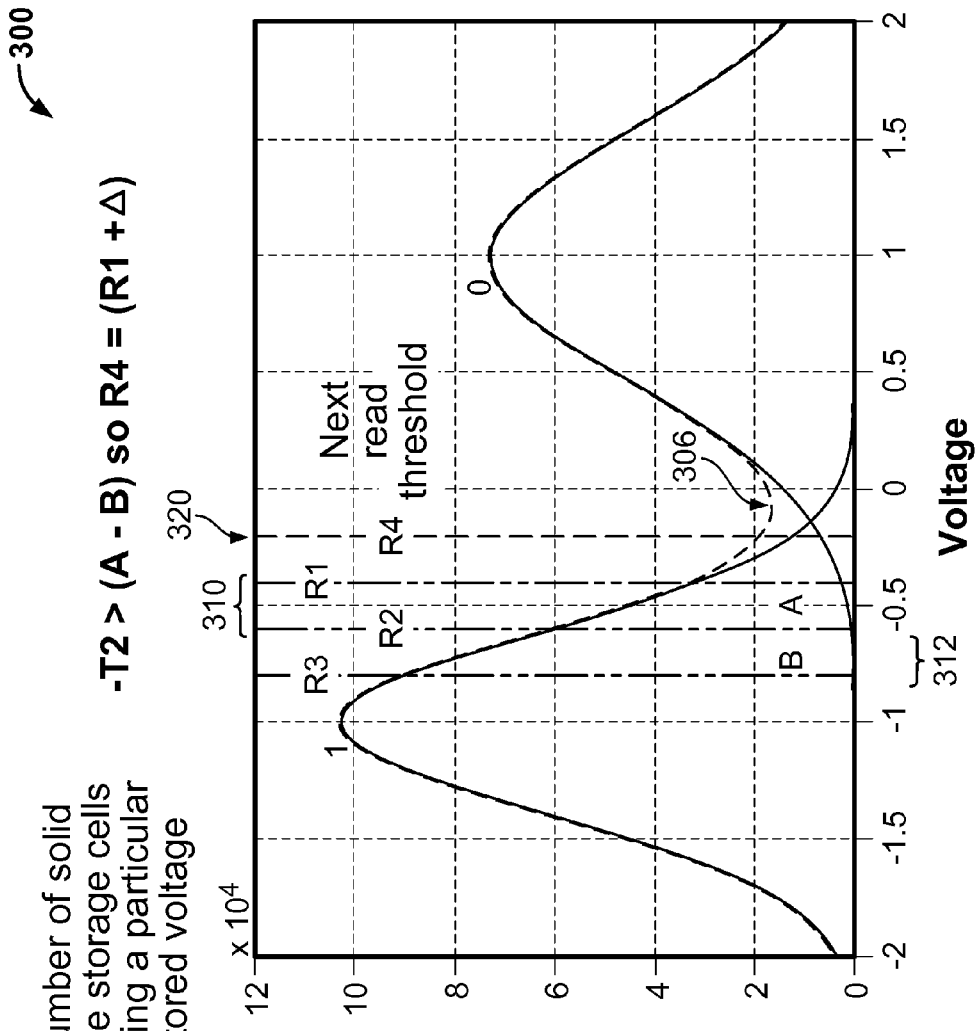
FIG. 3 is a diagram showing an embodiment of a negative gradient which is less than a second threshold.

FIG. 3 is a diagram showing an embodiment of a negative gradient which is less than a second threshold. In diagram 300, first voltage range 310 has a range of [R2, R1] and second voltage range 312 has a range of [R3, R2]; B cells have a stored voltage which falls in the range [R3, R2] and A cells have a stored voltage which falls in the range [R2, R1].

In this example, −T2>(A−B) (where T2 is a positive value) so a next read threshold of R4=(R1+Δ) is selected since the gradient is negative and it is below a second threshold. As described above, a negative gradient (at least in this example) corresponds to the belief that the local minimum of function 306 is believed to be to the right of first voltage range 310 and second voltage range 312.

Figure 4:
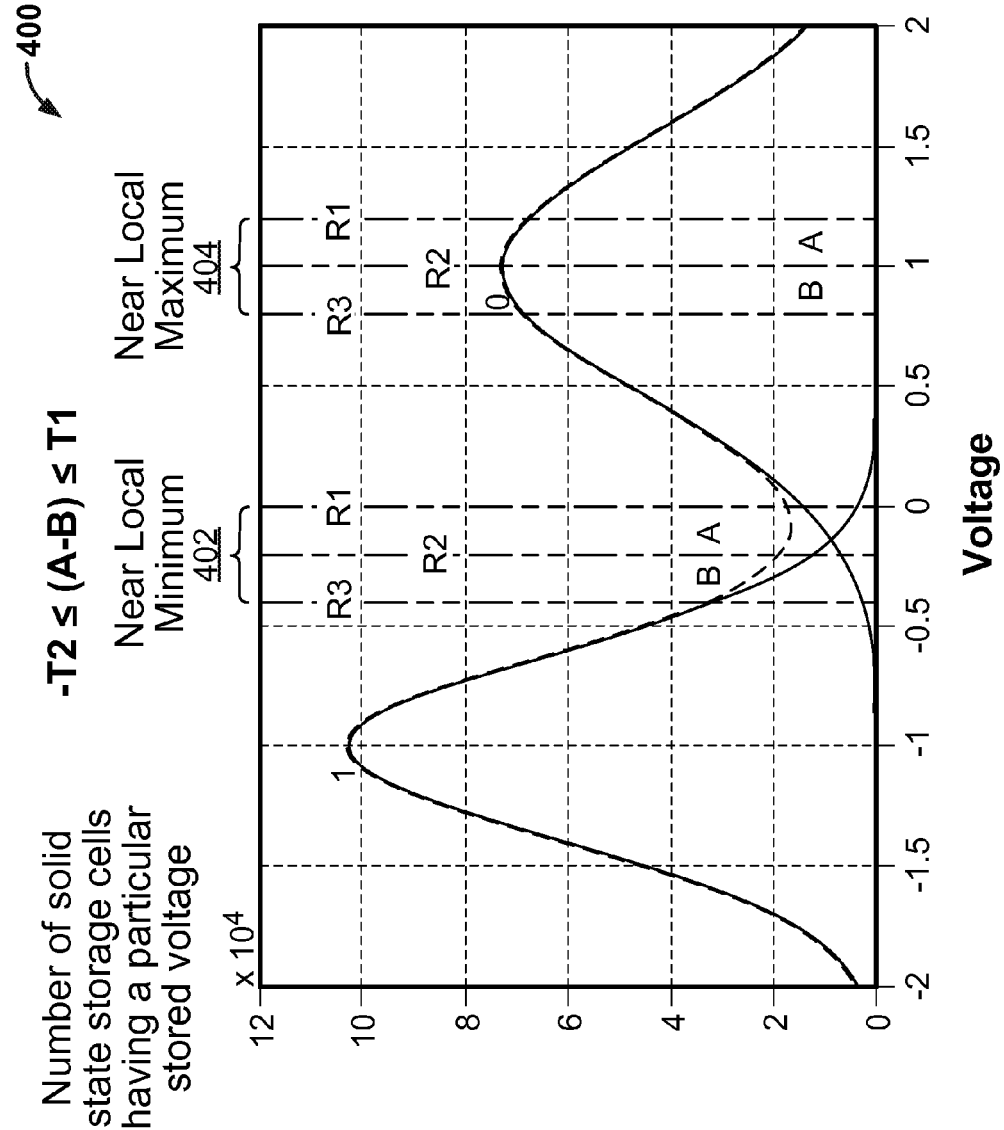
FIG. 4 is a diagram showing an embodiment of a gradient which is between a first threshold and second threshold.

FIG. 4 is a diagram showing an embodiment of a gradient which is between a first threshold and second threshold. As in the previous examples, three reads have been performed and a next/fourth read threshold is being determined (e.g., because error correction decoding has yet to successfully complete). In diagram 400, −T2≤(A−B)≤T1 where both T1 and T2 are positive. When this condition is met, there are two possibilities as is shown in diagram 300. In region 402, the first and second voltage ranges are near a local minimum. In region 404, the first and second voltage ranges are near a local maximum.

In this example, to differentiate between the two possibilities (i.e., being near a local minimum as opposed to a local maximum), the magnitudes of the first count and the second count (i.e., |A| and |B|) are evaluated. When near a local minimum (as in 402), the magnitudes of the first count and the second count will be (relatively) small. When near a local maximum (as in 404), the magnitudes of the first count and second count will be (relatively) large. In one example, if |A|>T3 and |B|>T4, then a local maximum is declared, otherwise a local minimum is declared. In another example, if |A|>T3 or |B|>T4, then a local maximum is declared, otherwise a local minimum is declared.

If it is determined that the system has gone "directly" to a local minimum (e.g., after three reads which is the earliest point at which a gradient can be calculated), then a "sweep" around R2 is performed. For example, a read with a read threshold of R2 plus or minus a small offset may be tried. If error correction decoding is unsuccessful after that, then a read using a different read threshold near R2 may be tried next. In some embodiments, a sweep goes from right to left (or from left to right). In some embodiments, a sweep alternates sides around R2 (e.g., to the left of R2, then to the right of R2, then back to the left of R2, etc.).

If it is determined that the system has gone directly to a local maximum (e.g., as described above, after the first three reads) then in some embodiments the process restarts with a new value of R1 (e.g., erasing any values of A, B, $Z_{R1}$, $Z_{R2}$, etc.). In some embodiments, if a system goes directly to a local maximum, then it is assumed (e.g., randomly or using a fixed decision) that either (A−B)>T1 or −T2>(A−B) which forces the system to pick a next read threshold which is either to the left or to the right (respectively) of the first and second voltage ranges.

In some embodiments, a decision at 106 depends (e.g., in addition to a current gradient) upon a previous gradient. The following table shows an example where selection of a next read threshold depends both on a gradient after the first three reads as well as a gradient after the fourth read. In the table below, A' and B' are updated numbers of solid state storage cells having a stored voltage within a particular range. In FIG. 2, for example, A corresponds to a count associated with a voltage range on a right side (i.e., [R2, R1]) and B corresponds to a count associated with a voltage range on a left side (i.e., [R3, R2]) after the first three reads. Similarly, A' corresponds to an updated count associated with a voltage range on a right side (i.e., [R3, R2]) and B' corresponds to an updated count associated with a voltage range on the right side (i.e., [R4, R3]) for the second through fourth reads.

TABLE 1

Example next read thresholds (R4 and R5) for various combinations of a gradient after the first three reads and a gradient after the fourth read.

| Gradient After First 3 Reads | R4 | Gradient After 4$^{th}$ Read | R5 |
| --- | --- | --- | --- |
| (A − B) > T1 | Local minimum is to the left, so R4 = (R3 − Δ) | (A' − B') > T1 | Local minimum is (still) to the left, so R5 = (R4 − Δ) |
| (A − B) > T1 | Local minimum is to the left, so R4 = (R3 − Δ) | −T2 > (A' − B') | Overshot a local minimum, so sweep around R3 or R2 |
| (A − B) > T1 | Local minimum is to the left, so R4 = (R3 − Δ) | −T2 ≤ (A' − B') ≤ T1 | Local minimum is near, so sweep around R4 or R3 |
| −T2 > (A − B) | Local minimum is to the right, so R4 = (R1 + Δ) | (A' − B') > T1 | Overshot a local minimum, so sweep around R1 or R2 |
| −T2 > (A − B) | Local minimum is to the right, so R4 = (R1 + Δ) | −T2 > (A' − B') | Local minimum is (still) to the right, so R5 = (R4 + Δ) |
| −T2 > (A − B) | Local minimum is to the right, so R4 = (R1 + Δ) | −T2 ≤ (A' − B') ≤ T1 | Local minimum is near, so sweep around R4 or R1 |

TABLE 1-continued

Example next read thresholds (R4 and R5) for various combinations of a gradient after the first three reads and a gradient after the fourth read.

| Gradient After First 3 Reads | R4 | Gradient After 4$^{th}$ Read | R5 |
|---|---|---|---|
| $-T2 \leq (A - B) \leq T1$ and near a local minimum | Local minimum is near, so sweep around R2 | N/A (Done with gradient descent; "sweeping" will select next read threshold(s) as/if needed) | |
| $-T2 \leq (A - B) \leq T1$ and near a local maximum | Assume local minimum is to the left, so R4 = (R3 − Δ) | (A' − B') > T1 | Local minimum is (still) to the left, so R5 = (R4 − Δ) |
| $-T2 \leq (A - B) \leq T1$ and near a local maximum | Assume local minimum is to the left, so R4 = (R3 − Δ) | $-T2 > (A' - B')$ | Guessed wrong and local minimum is to the right, so R5 = (R1 + Δ) |
| $-T2 \leq (A - B) \leq T1$ and near a local maximum | Assume local minimum is to the left, so R4 = (R3 − Δ) | $-T2 \leq (A' - B') \leq T1$ | Determine whether the last three reads are near a local maximum or a local minimum again |
| $-T2 \leq (A - B) \leq T1$ and near a local maximum | Assume local minimum is to the right, so R4 = (R1 + Δ) | (A' − B') > T1 | Guessed wrong and local minimum is to the left, so R5 = (R3 − Δ) |
| $-T2 \leq (A - B) \leq T1$ and near a local maximum | Assume local minimum is to the right, so R4 = (R1 + Δ) | $-T2 > (A' - B')$ | Local minimum is (still) to the right, so R5 = (R4 + Δ) |
| $-T2 \leq (A - B) \leq T1$ and near a local maximum | Assume local minimum is to the right, so R4 = (R1 + Δ) | $-T2 \leq (A' - B') \leq T1$ | Determine whether the last three reads are near a local maximum or a local minimum again |

As is shown in the above example table, when it comes time to select a 5$^{th}$ read threshold, the decision depends not only on the value of the gradient after the 4$^{th}$ read (i.e., A'−B'), but on the value of the gradient after the first three reads (i.e., A−B). See, for example, the first row where (A−B)>T1 and (A'−B') >T1 and the fourth row where −T2>(A−B) and (A'−B')>T1. Even though in both cases (A'−B')>T1, the 5$^{th}$ read thresholds selected are different and depend upon the value of the gradient after the first three reads. In the first case, the local minimum is still to the left, and so a 5$^{th}$ read threshold which is another Δ to the left is selected. In the second case, a local minimum was overshot, so a sweep around R1 or R2 is performed (e.g., because the 4$^{th}$ read threshold (R4) went too far and is "bad").

Figure 5:
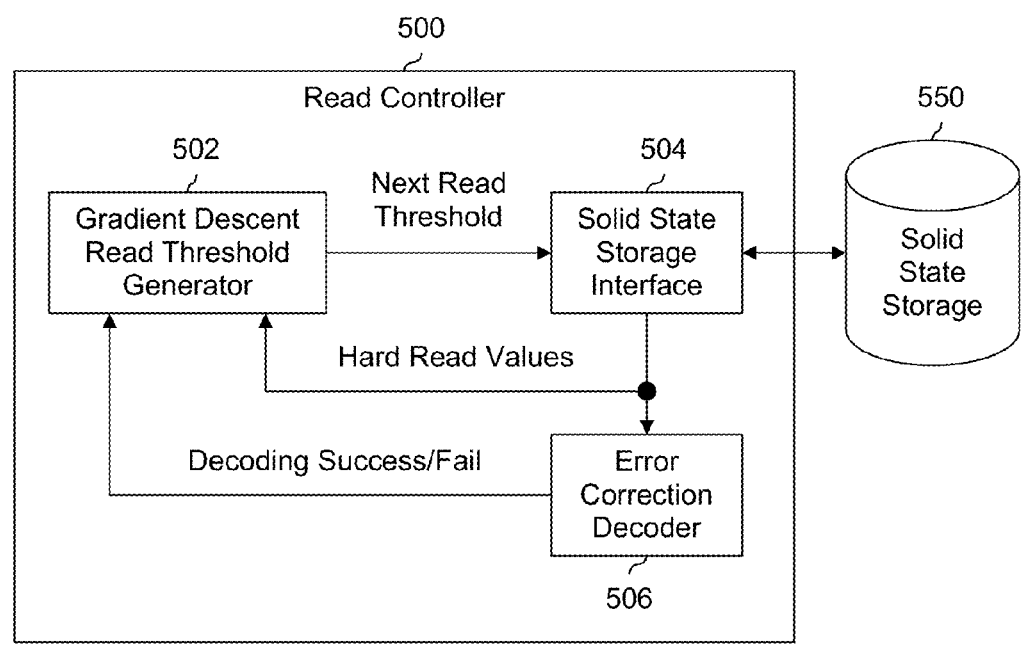
FIG. 5 is a diagram showing an embodiment of a system which generates a next read threshold using one or more gradients.

FIG. 5 is a diagram showing an embodiment of a system which generates a next read threshold using one or more gradients. In some embodiments, gradient descent read threshold generator 502 performs the example process described in FIG. 1. In some embodiments, read controller 500 is implemented on and/or using a semiconductor device, such as an application-specific integrated circuit (ASIC) or a field-programmable gate array (FPGA). For clarity, system components which are not related to the technique described herein are not shown. Note that any missing component is not automatically or necessarily excluding from a system which performs the technique described herein. For example, although a write controller is not shown, a system which performs the technique described herein may (and typically will) include a write controller.

Read controller 500 accesses solid state storage 550 (e.g., NAND Flash) using solid state storage interface 504. Depending upon the read threshold values specified by gradient descent read threshold generator 502, solid state storage interface 504 returns a variety of hard read values. The hard read values are passed to error correction decoder 506 (e.g., an LDPC decoder). If error correction decoding is successful, then a decoding success signal is sent to gradient descent read threshold generator 502 and the process ends. If decoding is unsuccessful, a fail signal is sent to gradient descent read threshold generator 502 and a next read threshold is generated.

For a fourth read threshold (if needed because error correction decoding has failed after the first three reads), gradient descent read threshold generator 502 uses the hard read values returned from the first, second, and third reads to calculate a gradient and select a fourth read threshold. For example, $Z_{R1}$, $Z_{R2}$, and $Z_{R3}$ and/or $O_{R1}$, $O_{R2}$ and $O_{R3}$ may be generated from the hard read values returned from the first, second, and third reads; from those values, A and B may be generated; from A and B, the gradient may be determined.

Figure 6:
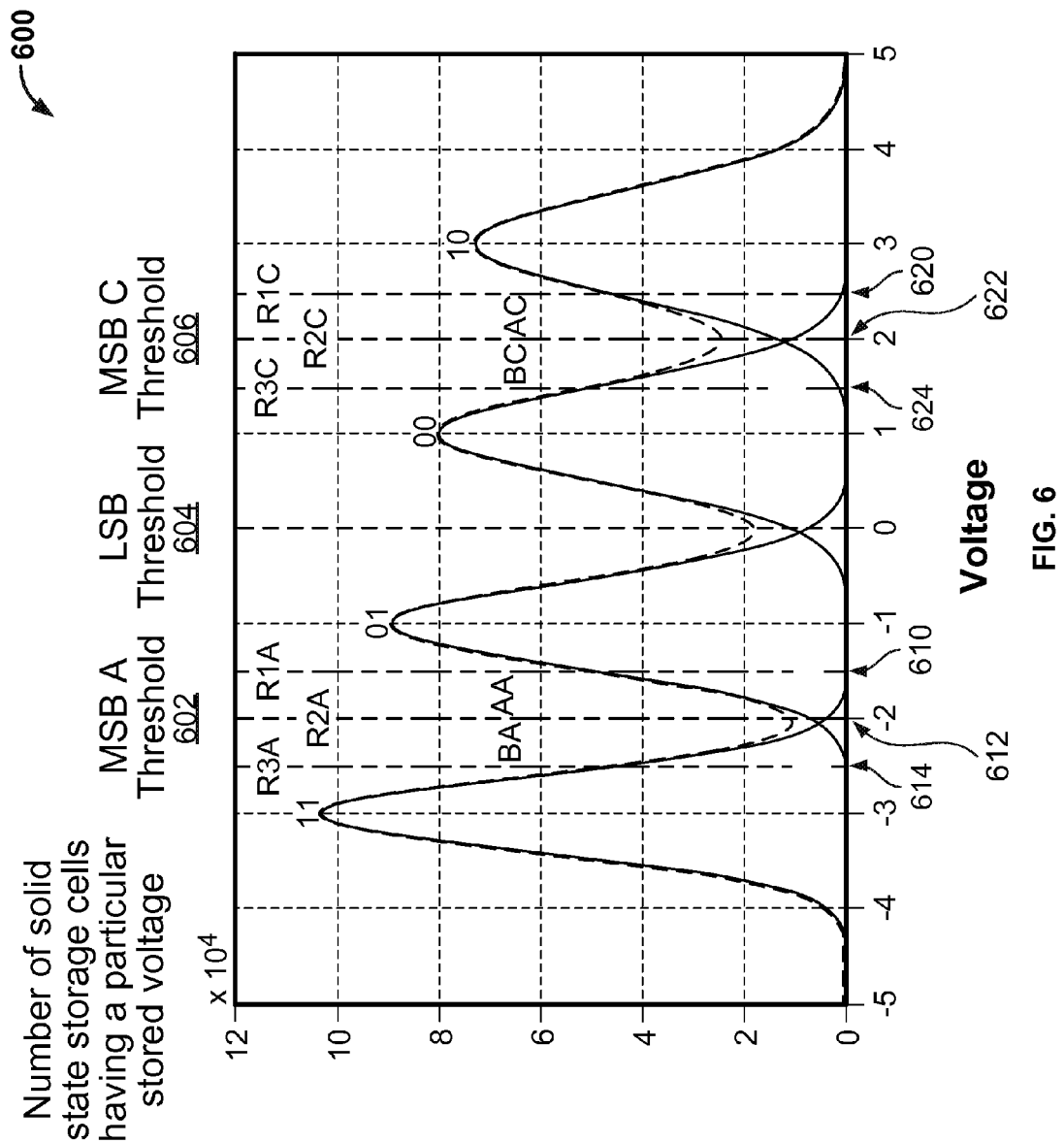
FIG. 6 is a diagram showing an embodiment of an MLC system in which gradient descent is used to simultaneously find two or more new read thresholds at a time.

FIG. 6 is a diagram showing an embodiment of an MLC system in which gradient descent is used to simultaneously find two or more new read thresholds at a time. In general, when a read is performed in an MLC system, three read thresholds must be specified: most significant bit (MSB) A threshold 602, least significant bit (LSB) threshold 604, and MSB C threshold 606. MLC cells which have a voltage between MSB A threshold 602 and MSB C threshold 606 are interpreted to have a MSB which has a value of 0 (i.e., 0X). MLC cells which have a voltage that is less than the MSB A read threshold or is greater than the MSB read threshold C are interpreted to have a MSB which has a value of 1 (i.e., 1X). MLC cells which have a voltage below LSB threshold 604 are interpreted to have a LSB which has a value of 1 (i.e., X1) and MLC cells which have a voltage above LSB threshold 604 are interpreted to have a LSB which has a value of 0 (i.e., X0).

In some other systems, when determining new or next read thresholds to use, two of the three read thresholds are held steady or constant while the third read threshold is varied. In contrast, with gradient descent, two or more read thresholds may be varied simultaneously while determining next read thresholds to use. In one example, LSB threshold 604 is held constant while, during a first read, MSB A threshold 602 is set to R1A (610) and MSB C threshold 606 is set to R1C (620). At a second read (while LSB threshold 604 is held constant, at least in this example), MSB A threshold 602 is set to R2A (612) and MSB C threshold 606 is set to R2C (622); at a third read, MSB A threshold 602 is set to R3A (614) and MSB C threshold 606 is set to R3C (624). These three reads may be used to obtain AA, BA, AC, and BC:

$$AA = Z_{R2A} - Z_{R1A} = O_{R1A} - O_{R2A};$$

$$BA = Z_{R3A} - Z_{R2A} = O_{R2A} - O_{R3A};$$

$$AC = Z_{R1C} - Z_{R2C} = O_{R2C} - O_{R1C}; \text{ and}$$

$$BC = Z_{R2C} - Z_{R3C} = O_{R3C} - O_{R2C}.$$

From AA and BA, a first gradient is determined which is used in determining a next MSB A threshold and from AC and BC, a second gradient is determined which is used in determining a next MSB C threshold.

One problem that other techniques have had is being able to distinguish between an MSB value of 1 resulting from a voltage greater than MSB C read threshold 606 and an MSB value of 1 resulting from a voltage less than MSB A read threshold 602. For systems which cannot distinguish between those two cases, the only solution is to only vary (at most) one read threshold at a time. For example, the MSB A read threshold and the LSB threshold may be held constant while the MSB C read threshold is varied.

In contrast, this technique is able to distinguish between the two cases described above which permits two or more read thresholds to be varied simultaneously. In MLC embodiments described herein, the value of the LSB is used to differentiate between the two cases. Using the value of this "sorting bit" (in this case, the LSB), it is known which count (i.e., $Z_{R1A}, \ldots, Z_{R1C}, \ldots, O_{R1A}, \ldots, O_{R1C}, \ldots$) to assign a cell to.

In some embodiments, the value of the LSB which is used as a sorting bit is an error corrected bit (i.e., after error correction coding has completed successfully, at least for the LSB sector or LSB codeword). In some applications, using an error corrected bit as a sorting bit is attractive because it is guaranteed that the value used is correct and thus the correct count is incremented. In some embodiments, the value of the LSB which is used as a sorting bit is an uncorrected bit (i.e., before error correction is performed). In some applications, using uncorrected data is made possible because we are just trying to distinguish between cells having a voltage smaller than the MSB A read threshold (e.g., at whatever level) from those cells that have voltages larger than the MSB C read threshold (e.g., at whatever level). Put another way, the cells being sorted are the ones that will "flip" near the MSB A read threshold or the MSB C read threshold, and thus have stored voltages in that vicinity. For those cells which are clustered around the MSB A read threshold and the MSB C read threshold, the LSB value will solidly be a 1 and a 0, respectively, since those cells being sorted (i.e., the ones which will flip near the MSB A read threshold or the MSB C read threshold) are nowhere near the LSB read threshold. As such, using an uncorrected LSB value as a sorting bit is acceptable for the purpose described above. This reasoning holds for uncorrected sorting bits in TLC systems and beyond.

Although the examples described above discuss an LSB threshold being held constant during the gradient descent read threshold determination process (i.e., while the MSB A and C read thresholds are varied), in some embodiments, an LSB read threshold is also varied while the MSB A read threshold and MSB C read threshold are varied. For example, it may be acceptable to vary the LSB read threshold so long as at any given read the LSB read threshold is between the MSB A read threshold and the MSB C read threshold. Varying the LSB read threshold at the same time as the MSB A and C read thresholds may be attractive because it further reduces the number of reads which must be performed in order to determine the next set of read threshold values.

The following figure shows an example of how a sorting bit (in this example, the LSB) is used to increment the correct count associated with an MSB.

Figure 7:
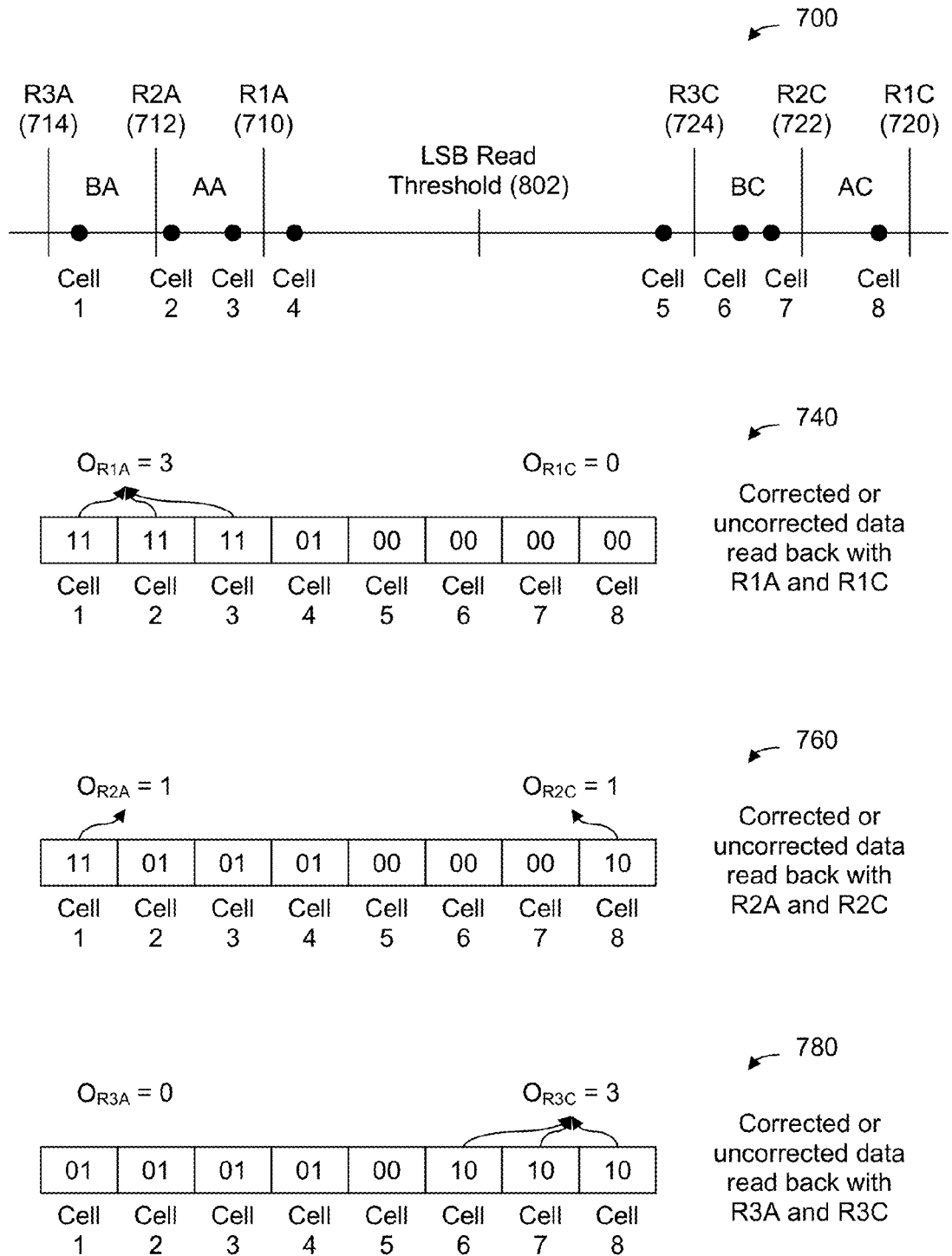
FIG. 7 is a diagram showing an embodiment of stored voltage levels for a group of cells in an MLC system.

FIG. 7 is a diagram showing an embodiment of stored voltage levels for a group of cells in an MLC system. In diagram 700, the voltage levels of the 8 MLC cells are shown with respect to LSB threshold 702, the various levels of the MSB A read threshold (i.e., R1A (710), R2A (712), and R3A (714)), and the various levels of the MSB C read threshold (i.e., R1C (720), R2C (722), and R3C (724)). For convenience, cell 1 has the lowest voltage level, cell 2 has the next lowest voltage level, and so on.

Diagram 740 shows counts associated with a first read at R1A (710) and R1C (720). At this read, numbers or counts of cells interpreted as having a 1 (e.g., $O_{R1A}$ and $O_{R1C}$) are used to determine a first and second gradient. (Naturally, in some other embodiments, numbers or counts of cells interpreted as having a 0 may be used.) In diagram 740, cells 1-3 have an MSB of 1. Since all three also have LSB values of 0, it is known that all of those cells were interpreted as having an MSB values of 1 because their voltage was below the MSB A read threshold (which at this read is R1A (710)). As a result, $O_{R1A}$ is set to 3 and $O_{R1C}$ is set to 0. As described above, corrected or uncorrected data may be used to obtain the values of $O_{R1A}$ and $O_{R1C}$.

Diagram 760 shows counts associated with a first read at R2A (712) and R2C (722). At this read, only cell 1 and cell 8 have an MSB of 1. Since cell 1 has an LSB of 1 and cell 8 has an LSB of 0, $O_{R2A}$ is set to 1 (because of cell 1) and $O_{R2C}$ is set to 1 (because of cell 8). Similarly, diagram 780 shows counts associated with a first read at R3A (714) and R3C (724). Since all of cells 6-7 have MSB values of 1 and LSB values of 0, $O_{R3A}$ is set to 0 and $O_{R3C}$ is set to 3.

With these example cell voltages and read thresholds, the following values of AA, BA, AC, and BC are determined:

$$AA = O_{R1A} - O_{R2A} = 3 - 1 = 2;$$

$$BA = O_{R2A} - O_{R3A} = 1 - 0 = 1;$$

$$AC = O_{R2C} - O_{R1C} = 1 - 0 = 1; \text{ and}$$

$$BC = O_{R3C} - O_{R2C} = 3 - 1 = 2.$$

Comparing the calculated values of AA, BA, AC, and BC to the voltage levels of the cells shown in diagram 700, it is noted that the calculated values match diagram 700.

Although not described herein, the sorting technique described above with respect to an MLC system may be used to simultaneously vary two or more read threshold values in TLC systems. For example, two of the three bits may be used as sorting bits to properly assign the third bit to an appropriate count or group.

Figure 8:
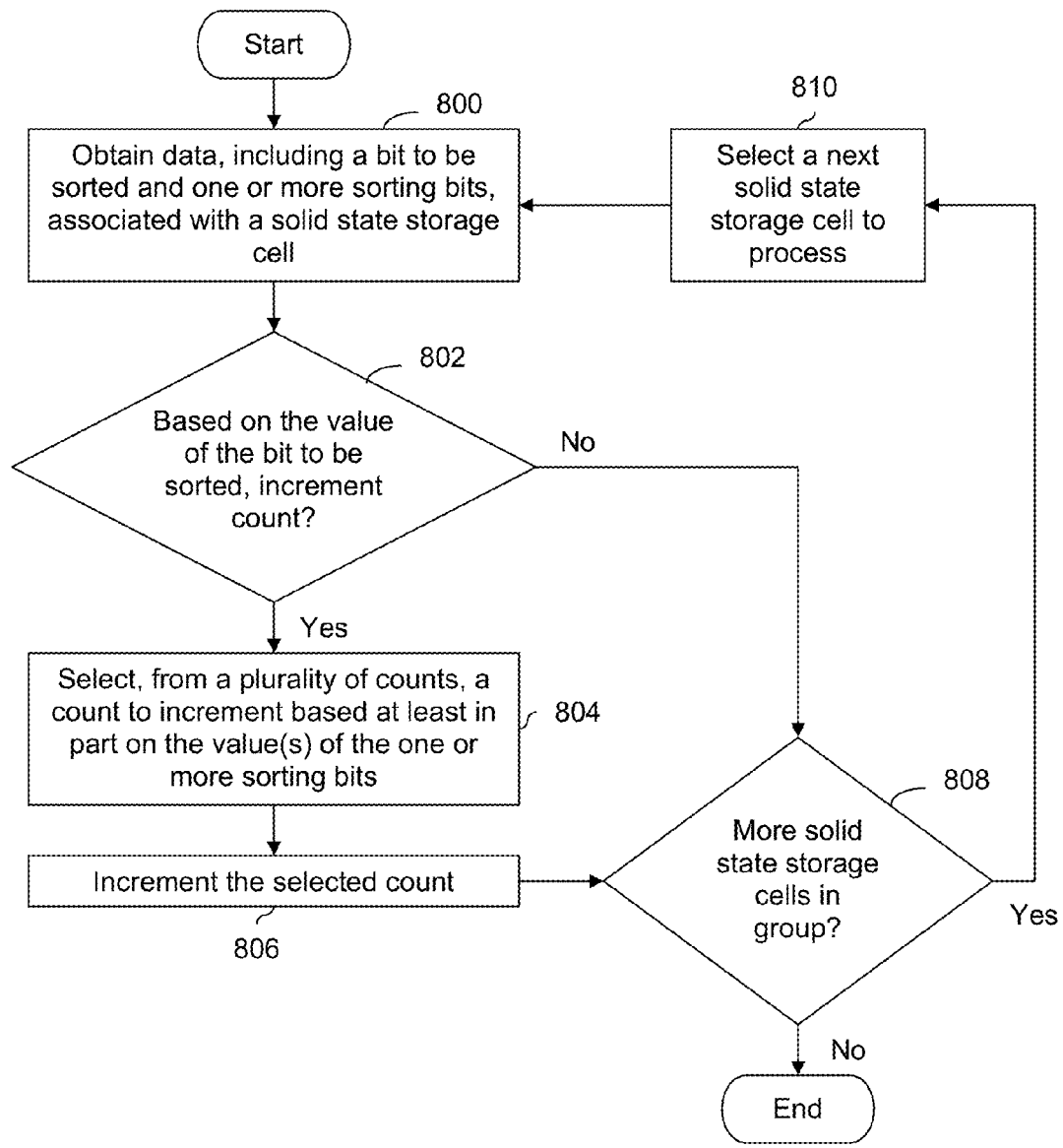
FIG. 8 is a flowchart illustrating a process associated with selecting a count to increment using one or more sorting bits.

FIG. 8 is a flowchart illustrating a process associated with selecting a count to increment using one or more sorting bits. The example process may be performed at each read in a gradient descent read threshold determination process. For example, the process shown in FIG. 8 may be performed at diagram 740, at diagram 760, and also at diagram 780 in FIG. 7. Referring to FIG. 1, the process may be used at step 100 and step 102 for MSB A read threshold and in a separate, independent run of FIG. 1 at step 100 and step 102 for MSB C read threshold. In some embodiments, the process enables or permits multiple read thresholds to be varied at the same time during a gradient descent read threshold generation process. In various embodiments, the process is used in a MLC system, a TLC system, etc.

At 800, data, including a bit to be sorted and one or more sorting bits, associated with a solid state storage cell is obtained. For example, in diagram 740 in FIG. 7, the data 11 may be obtained for cell 1. In various embodiments, the data obtained at 800 is error corrected data (e.g., output by an LDPC decoder or other error correction decoder) or uncorrected data (e.g., prior to processing by an error correction decoder).

It is determined at 802, based on the value of the bit to be sorted, whether to increment a count. For example, in the example of FIG. 7, counts associated with cells interpreted as having a 1 are used so since the data read back for cell is 1X, the decision at 802 is yes. If, however, counts associated with cells interpreted as having a 0 were used then the decision at 802 would be no for a data value of 1X.

If it is determined to increment at count at 802, then at 804 a count to increment is selected from a plurality of counts based at least in part on the value(s) of the one or more sorting bits. For example, in FIG. 7, the plurality of counts includes ($O_{R1A}, O_{R2A}, O_{R3A}, O_{R1C}, O_{R2C}, O_{R3C}$). For the read at diagram 704, the read count is 1, so the possible relevant counts are $O_{R1A}$ and $O_{R1C}$. For a data value of 11 for cell 1 at diagram 740, the sorting bit (in this example, the LSB) is 1 so the count $O_{R1A}$ is selected (e.g., since the LSB value indicates that cell 1 should be attributed to or assigned to a count associated with the MSB A read threshold). At 806, the selected count is incremented.

After incrementing at 806 or if it determined at 802 not to increment, it is determined at 808 if there are more solid state storage cells in a group. To continue the example from above, since the current cell being processed is cell 1 and there are 7 other cells, the decision at 808 would be yes. If so, a next solid state storage cell to process is selected at 810 (e.g., cell 2 after cell 1 has been processed).

Figure 9:
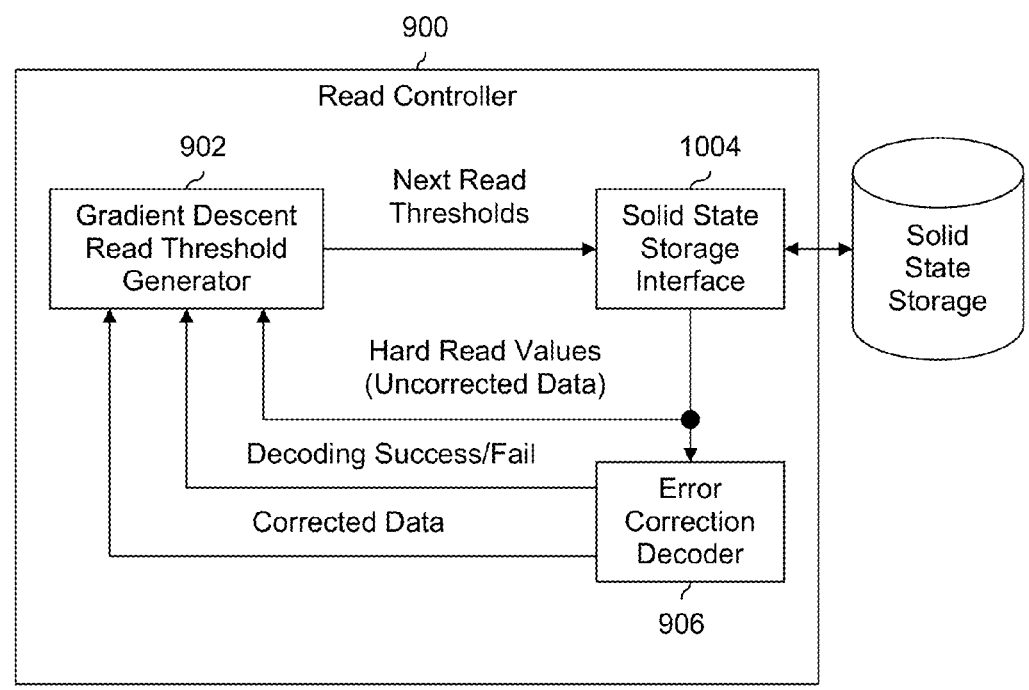
FIG. 9 is a diagram showing an embodiment of a system which uses corrected sorting bits or uncorrected sorting bits to select an appropriate count to increment.

FIG. 9 is a diagram showing an embodiment of a system which uses corrected sorting bits or uncorrected sorting bits to select an appropriate count to increment. In the example shown, gradient descent read threshold generator 902 performs the example process shown in FIG. 9. In some embodiments, the sorting bits (e.g., used to select an appropriate count to increment) are obtained from the hard read values (i.e., uncorrected data) from solid state storage interface 904. In some embodiments, the sorting bits are obtained from the corrected data which is output by error correction decoder 906.

In some embodiments, gradient descent read threshold generator 902 has a control signal (not shown) which enables the system to switch between a first mode where uncorrected sorting bits are used and a second mode where corrected sorting bits are used. In some embodiments, a system starts in the first mode and as the number of attempts reaches or surpasses some threshold, the system switches over to the second mode (e.g., where more processing power is consumed, but because of the larger number of attempts this may be acceptable).

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:
1. A system for determining a read threshold, comprising:
a read threshold generator configured to:
   determine a first number of solid state storage cells having a stored voltage which falls into a first voltage range, where the first voltage range is [R2, R1], including by:
      obtaining $Z_{R1}$, which is the number of solid state storage cells read back as a 0 when read at a read threshold of R1; and
      obtaining $Z_{R2}$, which is the number of solid state storage cells read back as a 0 when read at a read threshold of R2;
   determine a second number of solid state storage cells having a stored voltage which falls into a second voltage range, where the second voltage range is [R3, R2] and (R1−R2)=(R2−R3), including by:
      obtaining $Z_{R3}$, which is the number of solid state storage cells read back as a 0 when read at a read threshold of R3;
   determine a gradient by taking a difference between the first number of solid state storage cells and the second number of solid state storage cells; and
   determine a next read threshold based at least in part on the gradient; and
an interface configured to communicate with solid state storage.

2. The system of claim 1, wherein the system is implemented using a semiconductor device, including one or more of the following: an application-specific integrated circuit (ASIC) or a field-programmable gate array (FPGA).

3. A system for determining a read threshold, comprising:
a read threshold generator configured to:
   determine a first number of solid state storage cells having a stored voltage which falls into a first voltage range, where the first voltage range is [R2, R1], including by:
      obtaining $O_{R1}$, which is the number of solid state storage cells read back as a 1 when read at a read threshold of R1; and
      obtaining $O_{R2}$, which is the number of solid state storage cells read back as a 1 when read at a read threshold of R2;
   determine a second number of solid state storage cells having a stored voltage which falls into a second voltage range, where the second voltage range is [R3, R2] and (R1−R2)=(R2−R3), including by:
      obtaining $O_{R3}$, which is the number of solid state storage cells read back as a 1 when read at a read threshold of R3;
   determine a gradient by taking a difference between the first number of solid state storage cells and the second number of solid state storage cells; and
   determine a next read threshold based at least in part on the gradient; and
an interface configured to communicate with solid state storage.

4. A system for determining a read threshold, comprising:
a read threshold generator configured to:
   determine a first number of solid state storage cells having a stored voltage which falls into a first voltage range, wherein the first voltage range is [R2, R1];
   determine a second number of solid state storage cells having a stored voltage which falls into a second voltage range, wherein the second voltage range is [R3, R2] and $\Delta$=(R1−R2)=(R2−R3);
   determine a gradient by taking a difference between the first number of solid state storage cells and the second number of solid state storage cells; and determine a next read threshold based at least in part on the gradient, including by:
  evaluating the sign and the magnitude of the gradient;
  in the event the evaluation of the sign and the magnitude of the gradient indicates that a local minimum is believed to be less than R3, setting the next read threshold to be R3−Δ; and
  in the event the evaluation of the sign and the magnitude of the gradient indicates that a local minimum is believed to be greater than R1, setting the next read threshold to be R1+Δ; and
an interface configured to communicate with solid state storage.

5. A system for determining a read threshold, comprising:
a read threshold generator configured to:
  determine a first number of solid state storage cells having a stored voltage which falls into a first voltage range;
  determine a second number of solid state storage cells having a stored voltage which falls into a second voltage range, wherein the read threshold generator is configured to determine at least one of the first number of solid state storage cells or the second number of solid state storage cells by performing the following:
    obtaining data, including a bit to be sorted and one or more sorting bits, associated with a solid state storage cell;
    selecting, from a plurality of counts, a count to increment based at least in part on the value(s) of the one or more sorting bits; and
    incrementing the selected count;
  determine a gradient by taking a difference between the first number of solid state storage cells and the second number of solid state storage cells; and
  determine a next read threshold based at least in part on the gradient; and
an interface configured to communicate with solid state storage.

6. The system of claim 5, wherein the system includes a solid state storage cell that stores a plurality of bits.

7. The system of claim 5, wherein the obtained data includes uncorrected data.

8. The system of claim 5, wherein:
the obtained data includes corrected data; and
the read threshold generator is configured to obtain the corrected data from an error correction decoder.

9. A method for determining a read threshold, comprising:
determining a first number of solid state storage cells having a stored voltage which falls into a first voltage range, where the first voltage range is [R2, R1], including by:
  obtaining $Z_{R1}$, which is the number of solid state storage cells read back as a 0 when read at a read threshold of R1; and
  obtaining $Z_{R2}$, which is the number of solid state storage cells read back as a 0 when read at a read threshold of R2;
determining a second number of solid state storage cells having a stored voltage which falls into a second voltage range, where the second voltage range is [R3, R2] and (R1−R2)=(R2−R3), including by:
  obtaining $Z_{R3}$, which is the number of solid state storage cells read back as a 0 when read at a read threshold of R3;
using a processor to determine a gradient by taking a difference between the first number of solid state storage cells and the second number of solid state storage cells; and
determining a next read threshold based at least in part on the gradient.

10. The method of claim 9, wherein the method is performed by a semiconductor device, including one or more of the following: an application-specific integrated circuit (ASIC) or a field-programmable gate array (FPGA).

11. A method for determining a read threshold, comprising:
determining a first number of solid state storage cells having a stored voltage which falls into a first voltage range, where the first voltage range is [R2, R1], including by:
  obtaining $O_{R1}$, which is the number of solid state storage cells read back as a 1 when read at a read threshold of R1; and
  obtaining $O_{R2}$, which is the number of solid state storage cells read back as a 1 when read at a read threshold of R2;
determining a second number of solid state storage cells having a stored voltage which falls into a second voltage rang, where the second voltage range is [R3, R2] and (R1−R2)=(R2−R3), including by:
  obtaining $O_{R3}$, which is the number of solid state storage cells read back as a 1 when read at a read threshold of R3;
using a processor to determine a gradient by taking a difference between the first number of solid state storage cells and the second number of solid state storage cells; and
determining a next read threshold based at least in part on the gradient.

12. A method for determining a read threshold, comprising:
determining a first number of solid state storage cells having a stored voltage which falls into a first voltage range, wherein the first voltage range is [R2, R1];
determining a second number of solid state storage cells having a stored voltage which falls into a second voltage range, wherein the second voltage range is [R3, R2] and Δ=(R1−R2)=(R2−R3);
using a processor to determine a gradient by taking a difference between the first number of solid state storage cells and the second number of solid state storage cells; and
determining a next read threshold based at least in part on the gradient, including by:
  evaluating the sign and the magnitude of the gradient;
  in the event the evaluation of the sign and the magnitude of the gradient indicates that a local minimum is believed to be less than R3, setting the next read threshold to be R3−Δ; and
  in the event the evaluation of the sign and the magnitude of the gradient indicates that a local minimum is believed to be greater than R1, setting the next read threshold to be R1+Δ.

13. A method for determining a read threshold, comprising:
determining a first number of solid state storage cells having a stored voltage which falls into a first voltage range;
determining a second number of solid state storage cells having a stored voltage which falls into a second voltage range, wherein determining at least one of the first number of solid state storage cells or the second number of solid state storage cells includes:
  obtaining data, including a bit to be sorted and one or more sorting bits, associated with a solid state storage cell;

selecting, from a plurality of counts, a count to increment based at least in part on the value(s) of the one or more sorting bits; and
incrementing the selected count;
using a processor to determine a gradient by taking a difference between the first number of solid state storage cells and the second number of solid state storage cells; and
determining a next read threshold based at least in part on the gradient.

14. The method of claim 13, wherein the obtained data includes uncorrected data.

15. The method of claim 13, wherein:
the obtained data includes corrected data; and
the corrected data is obtained from an error correction decoder.

16. A computer program product for determining a read threshold, the computer program product being embodied in a non-transitory computer readable storage medium and comprising computer instructions for:
determining a first number of solid state storage cells having a stored voltage which falls into a first voltage range, where the first voltage range is [R2, R1], including by:
obtaining $Z_{R1}$, which is the number of solid state storage cells read back as a 0 when read at a read threshold of R1; and
obtaining $Z_{R2}$, which is the number of solid state storage cells read back as a 0 when read at a read threshold of R2;
determining a second number of solid state storage cells having a stored voltage which falls into a second voltage range, where the second voltage range is [R3, R2] and (R1−R2)=(R2−R3), including by:
obtaining $Z_{R3}$, which is the number of solid state storage cells read back as a 0 when read at a read threshold of R3;
determining a gradient by taking a difference between the first number of solid state storage cells and the second number of solid state storage cells; and
determining a next read threshold based at least in part on the gradient.

17. The system of claim 3, wherein the system is implemented using a semiconductor device, including one or more of the following: an application-specific integrated circuit (ASIC) or a field-programmable gate array (FPGA).

18. The system of claim 4, wherein the system is implemented using a semiconductor device, including one or more of the following: an application-specific integrated circuit (ASIC) or a field-programmable gate array (FPGA).

19. The system of claim 5, wherein the system is implemented using a semiconductor device, including one or more of the following: an application-specific integrated circuit (ASIC) or a field-programmable gate array (FPGA).

20. The method of claim 11, wherein the method is performed by a semiconductor device, including one or more of the following: an application-specific integrated circuit (ASIC) or a field-programmable gate array (FPGA).

21. The method of claim 12, wherein the method is performed by a semiconductor device, including one or more of the following: an application-specific integrated circuit (ASIC) or a field-programmable gate array (FPGA).

22. The method of claim 13, wherein the method is performed by a semiconductor device, including one or more of the following: an application-specific integrated circuit (ASIC) or a field-programmable gate array (FPGA).

23. A computer program product for determining a read threshold, the computer program product being embodied in a non-transitory computer readable storage medium and comprising computer instructions for:
determining a first number of solid state storage cells having a stored voltage which falls into a first voltage range, where the first voltage range is [R2, R1], including by:
obtaining $O_{R1}$, which is the number of solid state storage cells read back as a 1 when read at a read threshold of R1; and
obtaining $O_{R2}$, which is the number of solid state storage cells read back as a 1 when read at a read threshold of R2;
determining a second number of solid state storage cells having a stored voltage which falls into a second voltage rang, where the second voltage range is [R3, R2] and (R1−R2)=(R2−R3), including by:
obtaining $O_{R3}$, which is the number of solid state storage cells read back as a 1 when read at a read threshold of R3;
determining a gradient by taking a difference between the first number of solid state storage cells and the second number of solid state storage cells; and
determining a next read threshold based at least in part on the gradient.

24. A computer program product for determining a read threshold, the computer program product being embodied in a non-transitory computer readable storage medium and comprising computer instructions for:
determining a first number of solid state storage cells having a stored voltage which falls into a first voltage range, wherein the first voltage range is [R2, R1];
determining a second number of solid state storage cells having a stored voltage which falls into a second voltage range, wherein the second voltage range is [R3, R2] and $\Delta$=(R1−R2)=(R2−R3);
determining a gradient by taking a difference between the first number of solid state storage cells and the second number of solid state storage cells; and
determining a next read threshold based at least in part on the gradient, including by:
evaluating the sign and the magnitude of the gradient;
in the event the evaluation of the sign and the magnitude of the gradient indicates that a local minimum is believed to be less than R3, setting the next read threshold to be R3−$\Delta$; and
in the event the evaluation of the sign and the magnitude of the gradient indicates that a local minimum is believed to be greater than R1, setting the next read threshold to be R1+$\Delta$.

25. A computer program product for determining a read threshold, the computer program product being embodied in a non-transitory computer readable storage medium and comprising computer instructions for:
determining a first number of solid state storage cells having a stored voltage which falls into a first voltage range;
determining a second number of solid state storage cells having a stored voltage which falls into a second voltage range, wherein determining at least one of the first number of solid state storage cells or the second number of solid state storage cells includes:
obtaining data, including a bit to be sorted and one or more sorting bits, associated with a solid state storage cell;
selecting, from a plurality of counts, a count to increment based at least in part on the value(s) of the one or more sorting bits; and
incrementing the selected count;

determining a gradient by taking a difference between the first number of solid state storage cells and the second number of solid state storage cells; and determining a next read threshold based at least in part on the gradient.

\* \* \* \* \*

UNITED STATES PATENT AND TRADEMARK OFFICE
CERTIFICATE OF CORRECTION

Page 1 of 1

PATENT NO. : 8,923,062 B1
APPLICATION NO. : 13/935714
DATED : December 30, 2014
INVENTOR(S) : Lee et al.

It is certified that error appears in the above-identified patent and that said Letters Patent is hereby corrected as shown below:

In the Claims

In Column 14, Line 20, Claim 11, delete "rang" and insert --range-- therefore.

In Column 16, Line 14, Claim 23, delete "rang" and insert --range-- therefore.

Signed and Sealed this
Twenty-third Day of February, 2016

Michelle K. Lee
*Director of the United States Patent and Trademark Office*